(12) United States Patent
Fujita et al.

(10) Patent No.: US 9,761,631 B2
(45) Date of Patent: Sep. 12, 2017

(54) RADIATION IMAGE SENSOR (71) Applicant: HAMAMATSU PHOTONICS K.K., Hamamatsu-shi, Shizuoka (JP)

(72) Inventors: Kazuki Fujita, Hamamatsu (JP); Minoru Ichikawa, Hamamatsu (JP); Harumichi Mori, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/102,376

(22) PCT Filed: Nov. 28, 2014

(86) PCT No.: PCT/JP2014/081635
§ 371 (c)(1),
(2) Date: Jun. 7, 2016

(87) PCT Pub. No.: WO2015/087723
PCT Pub. Date: Jun. 18, 2015

(65) Prior Publication Data
US 2016/0315108 A1  Oct. 27, 2016

(30) Foreign Application Priority Data

Dec. 9, 2013 (JP) ................. 2013-254263

(51) Int. Cl.
*H01L 27/148* (2006.01)
*H01L 27/146* (2006.01)

(52) U.S. Cl.
CPC ...... *H01L 27/148* (2013.01); *H01L 27/14634* (2013.01); *H01L 27/14636* (2013.01)

(58) Field of Classification Search
None
See application file for complete search history.

(56) References Cited

U.S. PATENT DOCUMENTS 6,353,229 B1 * 3/2002 Polischuk ......... H01L 27/14659
250/370.09
6,489,618 B1 * 12/2002 Morishita ......... H01L 27/14676
250/370.09

(Continued)

FOREIGN PATENT DOCUMENTS

EP  2 230 690   9/2010
JP  H2-208974   8/1990

(Continued)

OTHER PUBLICATIONS

L.S. Jeromin, et al., "Application of a-Si Active-Matrix Technology in a X-Ray Detector Panel," 1997 SID International Symposium Digest of Technical Papers, May 1997, pp. 91-94.

(Continued)

*Primary Examiner* — Khaja Ahmad
(74) *Attorney, Agent, or Firm* — Drinker Biddle & Reath LLP (57) ABSTRACT

A radiation image sensor includes a charge generation section and, a circuit board accumulating and transferring charge generated in the charge generation section. The circuit board includes a semiconductor substrate, a capacitive section accumulating the charge generated in the charge generation section, and a MOS transistor in the semiconductor substrate. The MOS transistor includes one end connected to the capacitive section and another end connected to a wire transferring the charge. The capacitive section includes a partial region of the semiconductor substrate, a conductor layer disposed on the partial region and electrically connected to the charge generation section, and an insulating layer interposed between the partial region and the conductor layer.

7 Claims, 12 Drawing Sheets (56) References Cited

U.S. PATENT DOCUMENTS

| | | | |
|---|---|---|---|
| 2007/0131991 A1* | 6/2007 | Sugawa | ............ H01L 27/14603 257/292 |
| 2009/0201400 A1* | 8/2009 | Zhang | ............... H01L 27/14609 348/296 |
| 2009/0224162 A1 | 9/2009 | Inuiya et al. | |
| 2015/0060968 A1 | 3/2015 | Sa et al. | |

FOREIGN PATENT DOCUMENTS

| | | |
|---|---|---|
| JP | H06-342098 A | 12/1994 |
| JP | H07-130951 A | 5/1995 |
| JP | 2000-353808 A | 12/2000 |
| JP | 2003-004857 A | 1/2003 |
| JP | 2003-133538 | 5/2003 |
| JP | 2003-229596 | 8/2003 |
| JP | 2003-240861 A | 8/2003 |
| JP | 2004-055590 A | 2/2004 |
| JP | 2007-228460 | 9/2007 |
| JP | 2009-246014 A | 10/2009 |
| KR | 101334213 | 11/2013 |
| WO | WO 2015/019609 | 12/2015 |

OTHER PUBLICATIONS

International Preliminary Report on Patentability mailed Jun. 23, 2016 for PCT/JP2014/081635.

* cited by examiner

RADIATION IMAGE SENSOR

TECHNICAL FIELD

The present invention relates to a radiation image sensor.

BACKGROUND ART

Patent Literature 1 describes a device acquiring a digital radiographic image. This device is a direct conversion type of directly converting radiation into an electric signal and is provided with charge accumulation capacitors and charge transfer transistors disposed adjacent to a top surface of a dielectric substrate.

CITATION LIST

Patent Literature

Patent Literature 1: Japanese Unexamined Patent Publication No. H6-342098

SUMMARY OF INVENTION

Technical Problem

A device of a system converting a radiation image into a light figure and thereafter imaging the light figure to obtain image data (indirect conversion system) is known as solid-state imaging apparatus converting a radiation image such as an X-ray image into electric image data. The foregoing solid-state imaging apparatus also includes a device of a system directly imaging a radiation image to obtain image data (direct conversion system). In the device of the direct conversion system, for example, a solid-state material for directly converting radiation into charge (CdTe or the like) is provided on a circuit board accumulating and transferring charge.

In the device of the direct conversion system, it is necessary to dispose capacitive elements (capacitors) accumulating the charge, corresponding to respective pixels on the circuit board. The capacitive element includes, for example, a first layer formed on a glass substrate and made of an electroconductive material (metal or polysilicon or the like), an insulating film deposited on the first layer and made of an insulating material ($SiO_2$ or the like), and a second layer formed on the insulating film and made of an electroconductive material. The capacitive element having this configuration has the following problem. The smaller the thickness of the insulating film, the larger the capacitance per unit area. However, when the insulating film is deposited by CVD or the like, the insulating film needs to have a certain level of thickness, for preventing a short circuit between the first layer and the second layer, and it is thus difficult to increase the capacitance per unit area.

One aspect of the present invention is intended to provide a radiation image sensor capable of readily increasing the capacitance per unit area in a capacitive section.

Solution to Problem

One aspect of the present invention is a radiation image sensor including a charge generation section absorbing radiation to generate charge, and a circuit board accumulating and transferring the charge generated in the charge generation section. The charge generation section is disposed on the circuit board. The circuit board includes a semiconductor substrate, a capacitive section accumulating the charge generated in the charge generation section, and a MOS transistor in the semiconductor substrate, the MOS transistor including one end connected to the capacitive section and another end connected to a wire for transferring the charge. The capacitive section includes a partial region of the semiconductor substrate, a conductor layer disposed on the partial region and electrically connected to the charge generation section, and an insulating layer interposed between the partial region and the conductor layer.

In the present aspect, the capacitive section accumulating the charge includes the partial region of the semiconductor substrate, the conductor layer disposed on the partial region, and the insulating layer interposed between the partial region and the conductor layer. Namely, the partial region of the semiconductor substrate and the conductor layer face each other through the insulating layer and the partial region of the semiconductor substrate functions as one electrode in the capacitive section. For this reason, the present aspect achieves the following effects. The insulating layer can be formed, for example, by oxidation of the surface of the semiconductor substrate. In this case, the insulating layer can be formed with higher quality and in smaller thickness than in a configuration wherein the insulating layer is deposited by CVD or the like, and thus the capacitance per unit area in the capacitive section can be made larger. Therefore, an amount of accumulated charge in the capacitive section can be increased, and increase in area of each pixel can be suppressed. Since the increase in accumulated charge amount in the capacitive section leads to increase in saturation charge amount of each pixel, the increase in accumulated charge amount in the capacitive section also contributes to suppression of saturation. Therefore, even in such case where a transistor for charge transfer of a certain pixel does not operate for some reason or excess charge is generated because of incidence of a large amount of radiation, the capacitive section of the pixel can be prevented from saturating, whereby breakdown of the capacitive section and leakage of charge can be reduced. Since the capacitive section can be formed by the same process as an insulating oxide film and a gate electrode of the MOS transistor, manufacturing process can be made simpler.

In the present aspect, the conductor layer may be made of a same material as a constituent material of a gate electrode of the MOS transistor. In this case, the capacitive section can be simultaneously formed in a process of forming the MOS transistor, which can make the number of manufacturing processes smaller.

In the present aspect, the capacitive section may further include an impurity diffused region in which an impurity to impart a conductivity type different from a conductivity type of the semiconductor substrate is diffused, the impurity diffused region being located next to the partial region of the semiconductor substrate, the impurity diffused region and the conductor layer may be electrically connected to each other. In this case, the semiconductor substrate and the impurity diffused region form a pn junction. When the charge accumulation amount in the capacitive section exceeds a certain threshold, excess charge flows between the conductor layer and the semiconductor substrate through the impurity diffused region, which can eliminate the excess of charge. Therefore, even in such case where a transistor for charge transfer of a certain pixel does not operate for some reason or excess charge is generated because of incidence of a large amount of radiation, the breakdown of the capacitive section and the leakage of charge can be further reduced. Since the pn junction portion between the semiconductor substrate and the impurity diffused region includes a capacitive component, the capacitive component contributes to increase in capacitance of the capacitive section. Therefore, the accumulated charge amount in the capacitive section can be further increased, and the increase in area of each pixel can be suppressed.

In the present aspect, the charge generation section of bulk and the circuit board may be connected to each other by bump bonding. In the present aspect, the charge generation section may be made by depositing a material that absorbs radiation to generate charge, on the circuit board. In either case, the charge generation section can be suitably disposed on the circuit board.

Advantageous Effects of Invention

According to the foregoing one aspect of the present invention, the radiation image sensor can be provided as one capable of readily increasing the capacitance per unit area in the capacitive section.

DESCRIPTION OF EMBODIMENTS

An embodiment of the present invention will be described below in detail with reference to the accompanying drawings. In the description of the drawings the same elements will be denoted by the same reference signs, without redundant description.

Figure 1:
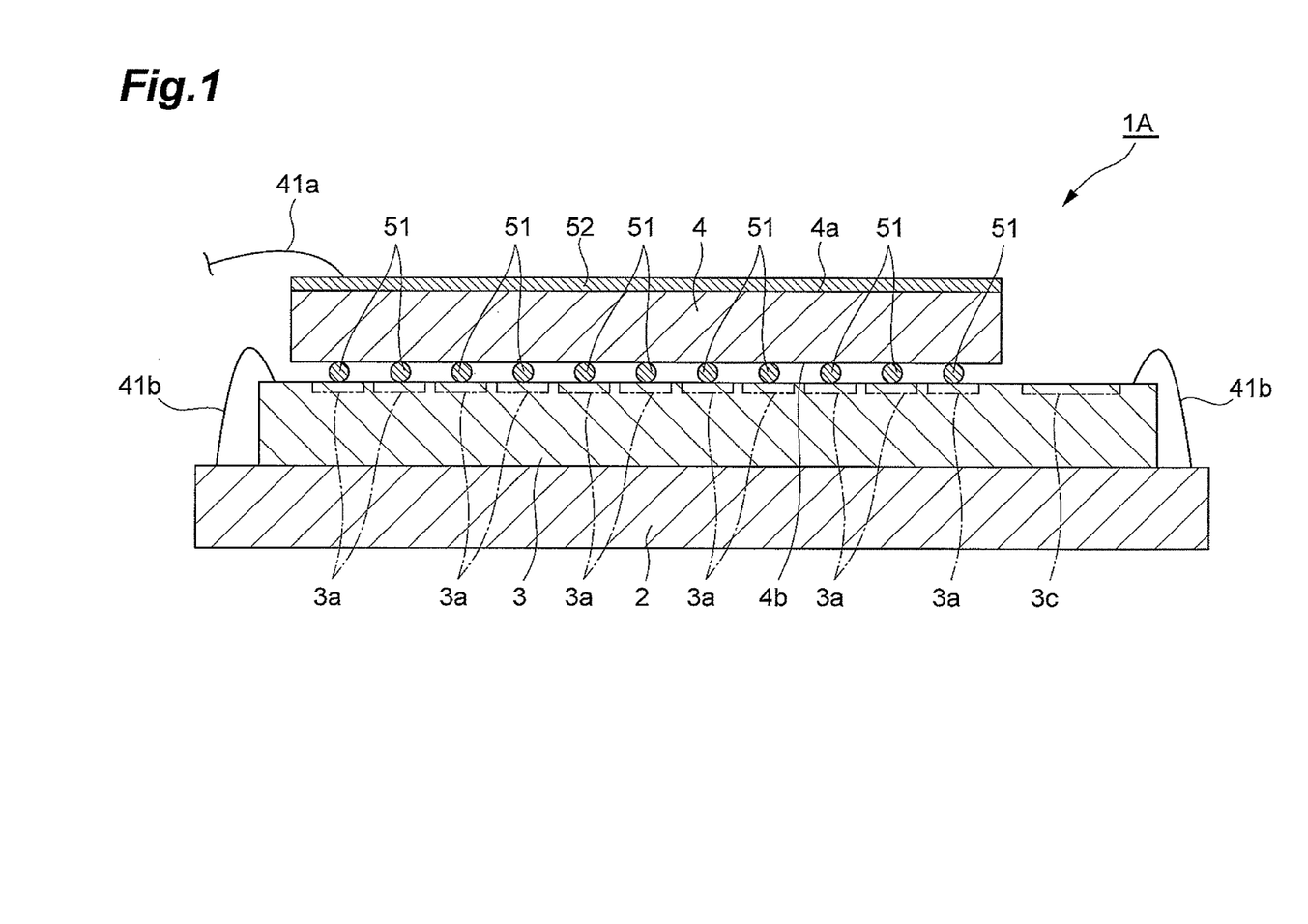
FIG. 1 is a side cross-sectional view illustrating a configuration of a radiation image sensor according to one embodiment of the present invention.
Figure 2:
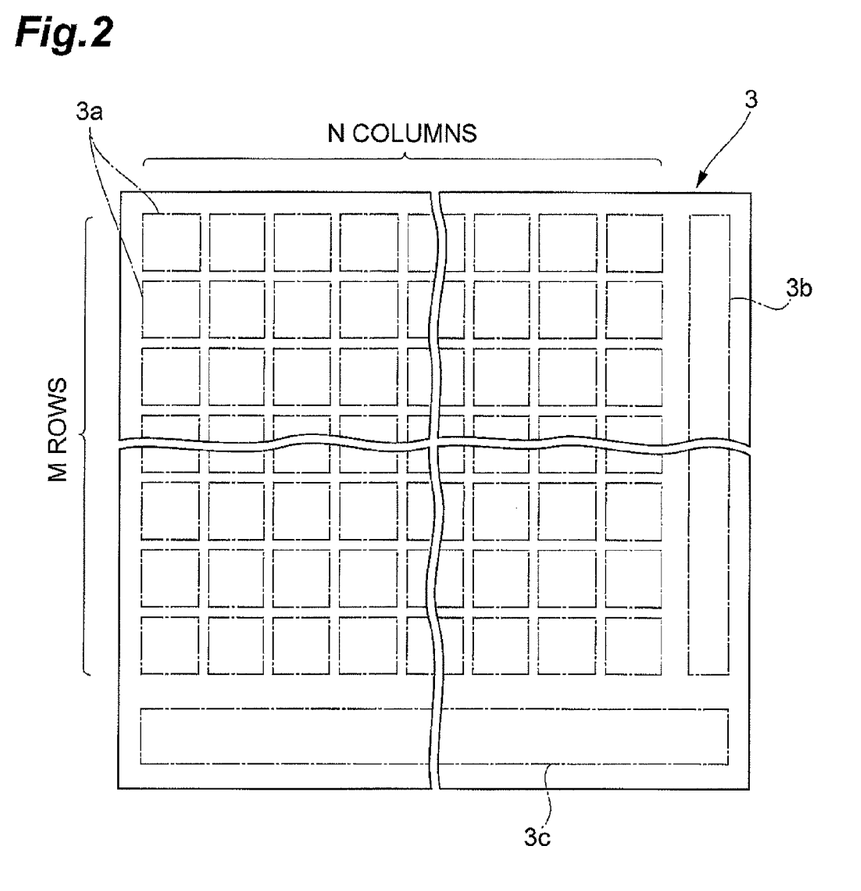
FIG. 2 is a plan view illustrating a configuration of a circuit board which the radiation image sensor includes.

FIG. 1 is a side cross-sectional view illustrating a configuration of a radiation image sensor 1A according to the present embodiment. FIG. 2 is a plan view illustrating a configuration of a circuit board 3 which the radiation image sensor 1A includes. As illustrated in FIG. 1, the radiation image sensor 1A of the present embodiment includes a base substrate 2, the circuit board 3 mounted on the base substrate 2, and a charge generation section 4 disposed on the circuit board 3.

The charge generation section 4 is a bulk member that absorbs radiation such as X-rays to generate charge in an amount corresponding to a dose of the radiation. The charge generation section 4 is of a plate shape spreading along a top surface of the circuit board 3 and includes a front surface 4a and a back surface 4b. A radiation image such as an X-ray image is incident to the front surface 4a. The back surface 4b faces the circuit board 3. The back surface 4b is electrically connected to the circuit board 3 by bump bonding (e.g., flip-chip bonding) using a plurality of bump electrodes 51. The charge generation section 4 is made, for example, of a material containing at least one of CdTe, CdZnTe, GaAs, InP, TlBr, $HgI_2$, $PbI_2$, Si, Ge, and a-Se. An electrode 52 is provided to cover the entire area of the front surface 4a, on the front surface 4a of the charge generation section 4 and one end of a bonding wire 41a for application of a bias voltage is connected to a surface of the electrode 52.

The circuit board 3 is a member that accumulates and transfers the charge generated in the charge generation section 4. The circuit board 3 is, for example, an integrated circuit such as ASIC and is electrically connected to the base substrate 2 through bonding wires 41b. As illustrated in FIG. 2, the circuit board 3 includes a plurality of pixel circuit sections 3a two-dimensionally arrayed in M rows×N columns (where M and N are integers of not less than 2). The plurality of pixel circuit sections 3a constitute respective pixels of the radiation image sensor 1A. Each pixel circuit section 3a includes a capacitive section for accumulating the charge received from the charge generation section 4, and a MOS transistor for outputting the accumulated charge from the capacitive section. The aforementioned bump electrodes 51 are provided in one-to-one correspondence to the respective pixel circuit sections 3a and are connected to the capacitive sections which the respective pixel circuit sections 3a include.

The circuit board 3 further includes a vertical shift register section 3b and a readout circuit section 3c. The vertical shift register section 3b is disposed next in the row direction to the plurality of pixel circuit sections 3a and makes charges accumulated in the pixel circuit sections 3a in the respective rows output in order row by row. The readout circuit section 3c is disposed next in the column direction to the plurality of pixel circuit sections 3a. The readout circuit section 3c includes a plurality of integration circuits provided corresponding to the respective columns of the pixel circuit sections 3a and each of these integration circuits generates a voltage value according to an amount of charge output from the pixel circuit section 3a in the corresponding column. The readout circuit section 3c retains the voltage values output from the respective integration circuits and sequentially outputs the voltage values thus retained.

Figure 3:
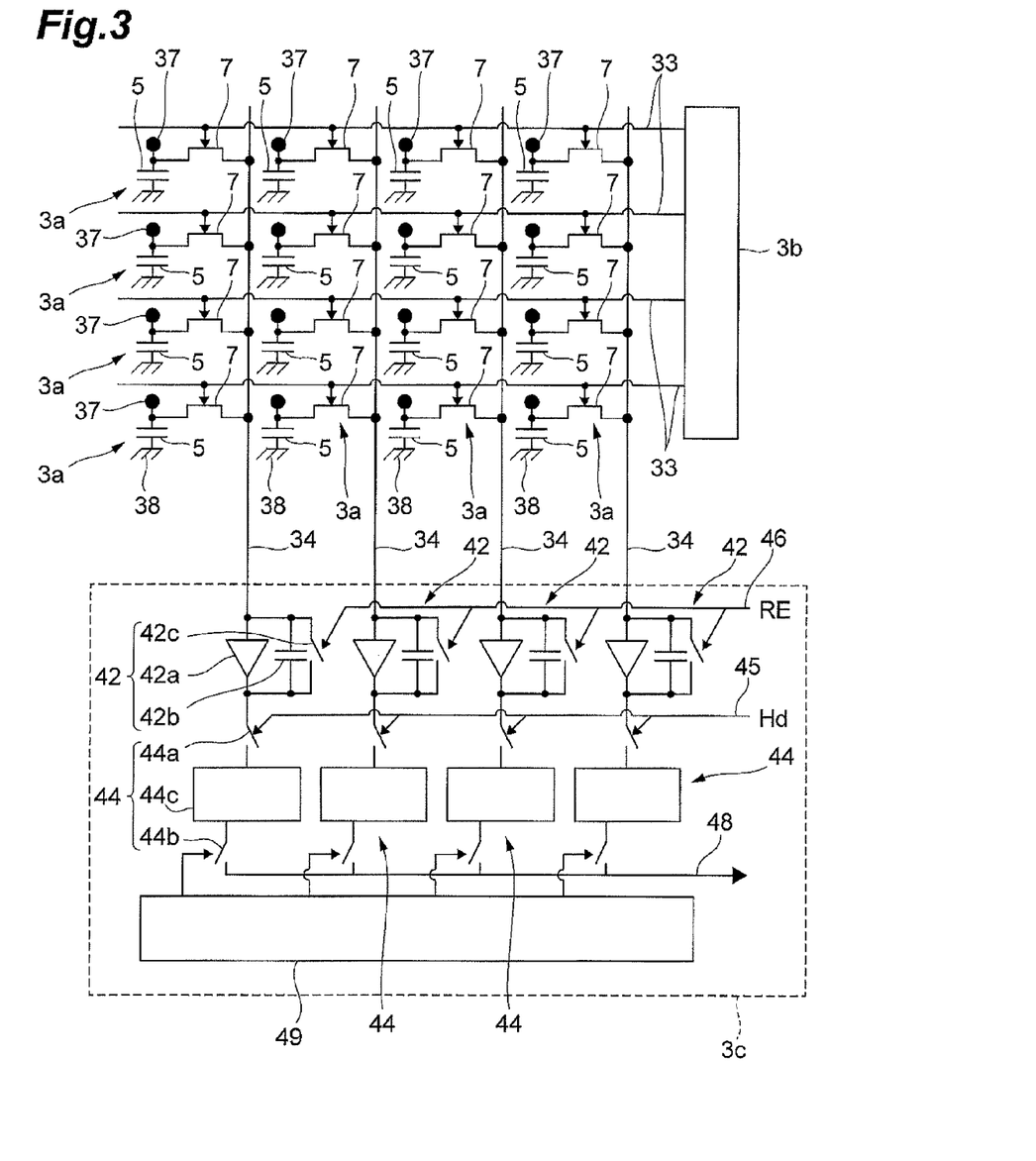
FIG. 3 is a drawing schematically illustrating an internal configuration of the circuit board.

FIG. 3 is a drawing schematically illustrating an internal configuration of the circuit board 3. FIG. 3 illustrates 4×4 pixel circuit sections 3a, on behalf of the (M×N) pixel circuit sections 3a. Each of the pixel circuit sections 3a includes a capacitive section (capacitor) 5 and a MOS transistor 7.

The capacitive section 5 accumulates the charge received from the charge generation section 4. One electrode of the capacitive section 5 is electrically connected to a connection pad 37 to which the bump electrode 51 (cf. FIG. 1) is connected, and to one end (e.g., a drain region) of the MOS transistor 7. Another electrode of the capacitive section 5 is electrically connected to a ground potential line (GND line) 38.

Another end (e.g., a source region) of the MOS transistor 7 is connected to a data wire 34 corresponding to a column to which the pixel circuit section 3a including the pertinent MOS transistor 7 belongs, out of N data wires (readout wires) 34 provided for the respective columns in order to transfer charge. Namely, the MOS transistor 7 includes the foregoing one end and the foregoing other end. One ends of the N respective data wires are connected respectively to the N integration circuits 42 which the readout circuit section 3c includes. A control terminal (gate terminal) of the MOS transistor 7 is connected to a gate wire 33 corresponding to a row to which the pixel circuit section 3a including the pertinent MOS transistor 7 belongs, out of M gate wires (control wires) 33 provided for the respective rows. The M gate wires 33 are connected to the vertical shift register section 3b. The vertical shift register section 3b generates row selection signals for controlling conduction states/non-conduction states of the MOS transistors 7 row by row and successively provides the row selection signals to the gate wires 33 of the respective rows.

When a row selection signal output from the vertical shift register section 3b to the gate wire 33 is a non-significant value (off voltage of the MOS transistor 7), the charge transferred from the charge generation section 4 is accumulated in the capacitive section 5 without being output to the data wire 34. When a row selection signal is a significant value (on voltage of the MOS transistor 7), the MOS transistor 7 turns into a conduction state and the charge accumulated in the capacitive section 5 is output via the MOS transistor 7 to the data wire 34. The charge output from the capacitive section 5 is transferred through the data wire 34 to the integration circuit 42.

The integration circuit 42 includes an amplifier 42a, a capacitive element 42b, and a discharge switch 42c and has a configuration of a so-called charge integration type. The capacitive element 42b and the discharge switch 42c are connected in parallel to each other and connected between an input terminal and an output terminal of the amplifier 42a. The input terminal of the amplifier 42a is connected to the data wire 34. A reset control signal RE is supplied through a reset wire 46 to the discharge switch 42c.

The reset control signal RE gives instructions for opening and closing operations of the discharge switches 42c of the N respective integration circuits 42. For example, when the reset control signal RE is a non-significant value (e.g., a high level), the discharge switch 42c is closed. This causes the capacitive element 42b to be discharged, thereby initializing the output voltage value of the integration circuit 42. When the reset control signal RE is a significant value (e.g., a low level), the discharge switch 42c is opened. This causes the charge input to the integration circuit 42 to be accumulated in the capacitive element 42b and a voltage value according to an amount of the accumulated charge is output from the integration circuit 42.

The readout circuit section 3c further includes N holding circuits 44. Each holding circuit 44 includes an input switch 44a, an output switch 44b, and a voltage holder 44c. One end of the voltage holder 44c is connected through the input switch 44a to the output end of the integration circuit 42. Another end of the voltage holder 44c is connected through the output switch 44b to a voltage output wire 48. A hold control signal Hd is fed through a hold wire 45 to the input switch 44a. The hold control signal Hd gives instructions for opening and closing operations of the input switches 44a of the N respective holding circuits 44. A column selection signal is fed from a horizontal shift register 49 to the output switch 44b of the holding circuit 44. The column selection signal gives instructions for opening and closing operations of the output switch 44b of the holding circuit 44 of a corresponding column.

When the hold control signal Hd turns from a high level to a low level, the input switch 44a turns from a close state into an open state. The voltage holder 44c holds a voltage value input to the holding circuit 44 when the input switch 44a turns from the close state into the open state. Thereafter, as the column selection signals from the horizontal shift register 49 turn from a low level to a high level in order column by column, the output switches 44b are successively closed. This results in successively outputting the voltage values held in the voltage holders 44c column by column to the voltage output wire 48.

Figure 4:
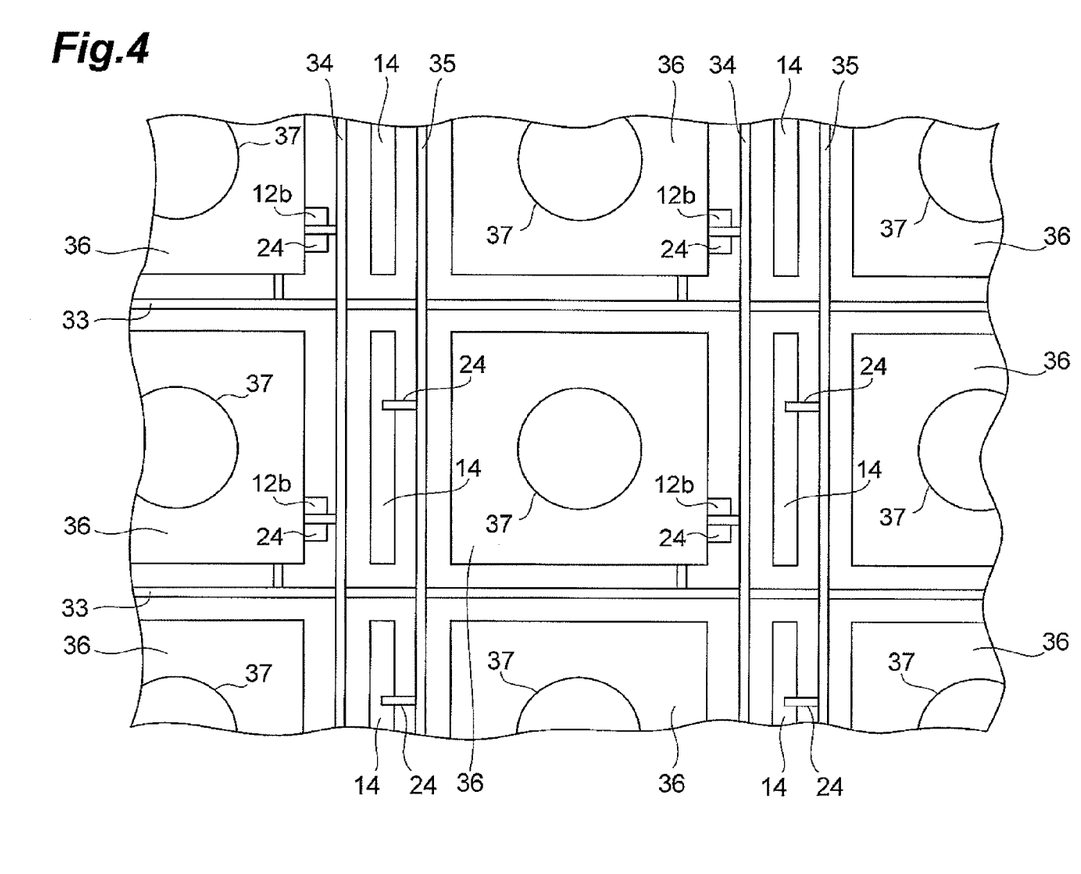
FIG. 4 is a top plan view illustrating a portion of the circuit board on an enlarged scale.
Figure 5:
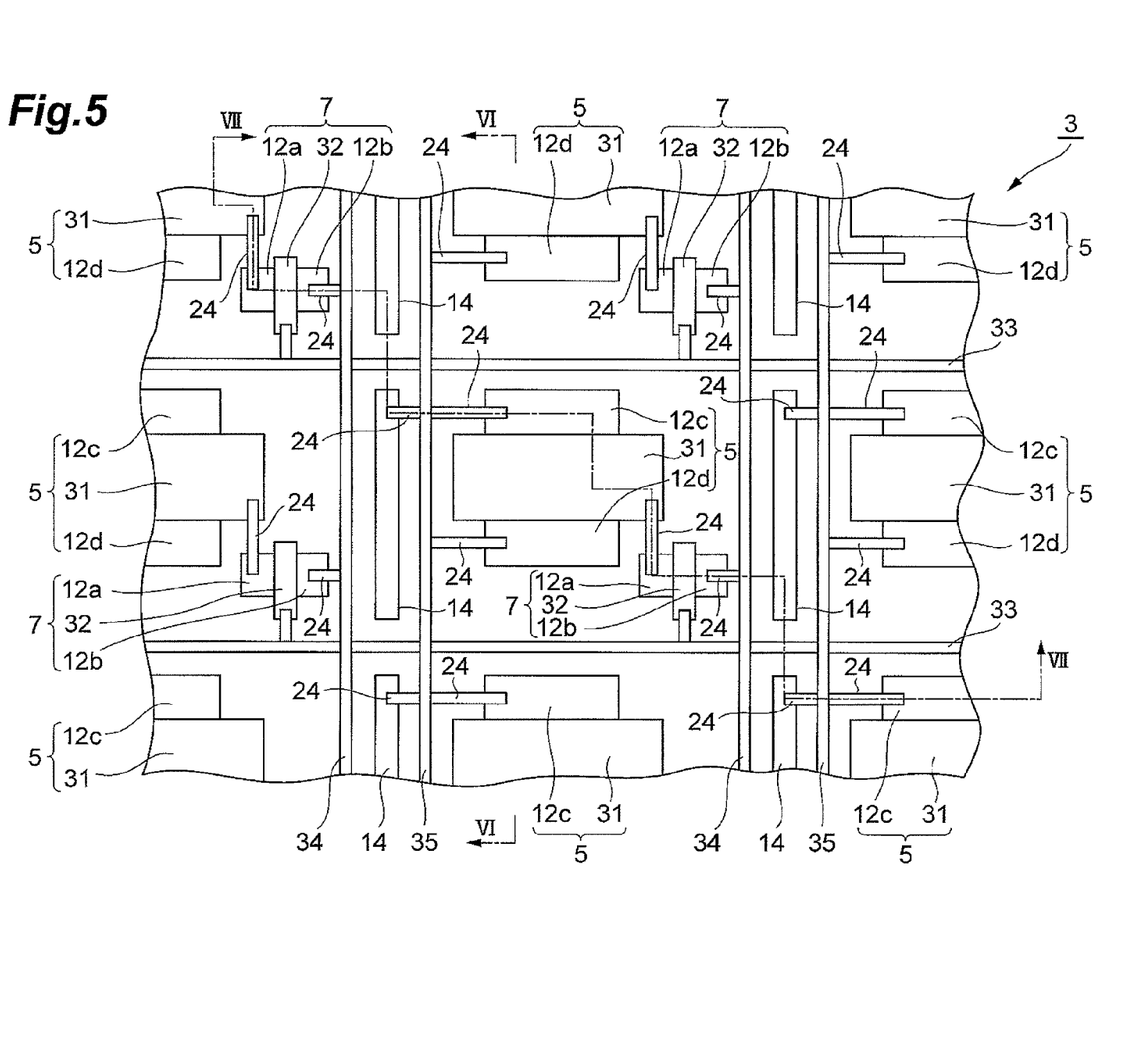
FIG. 5 is a top plan view illustrating a portion of the circuit board on an enlarged scale.
Figure 6:
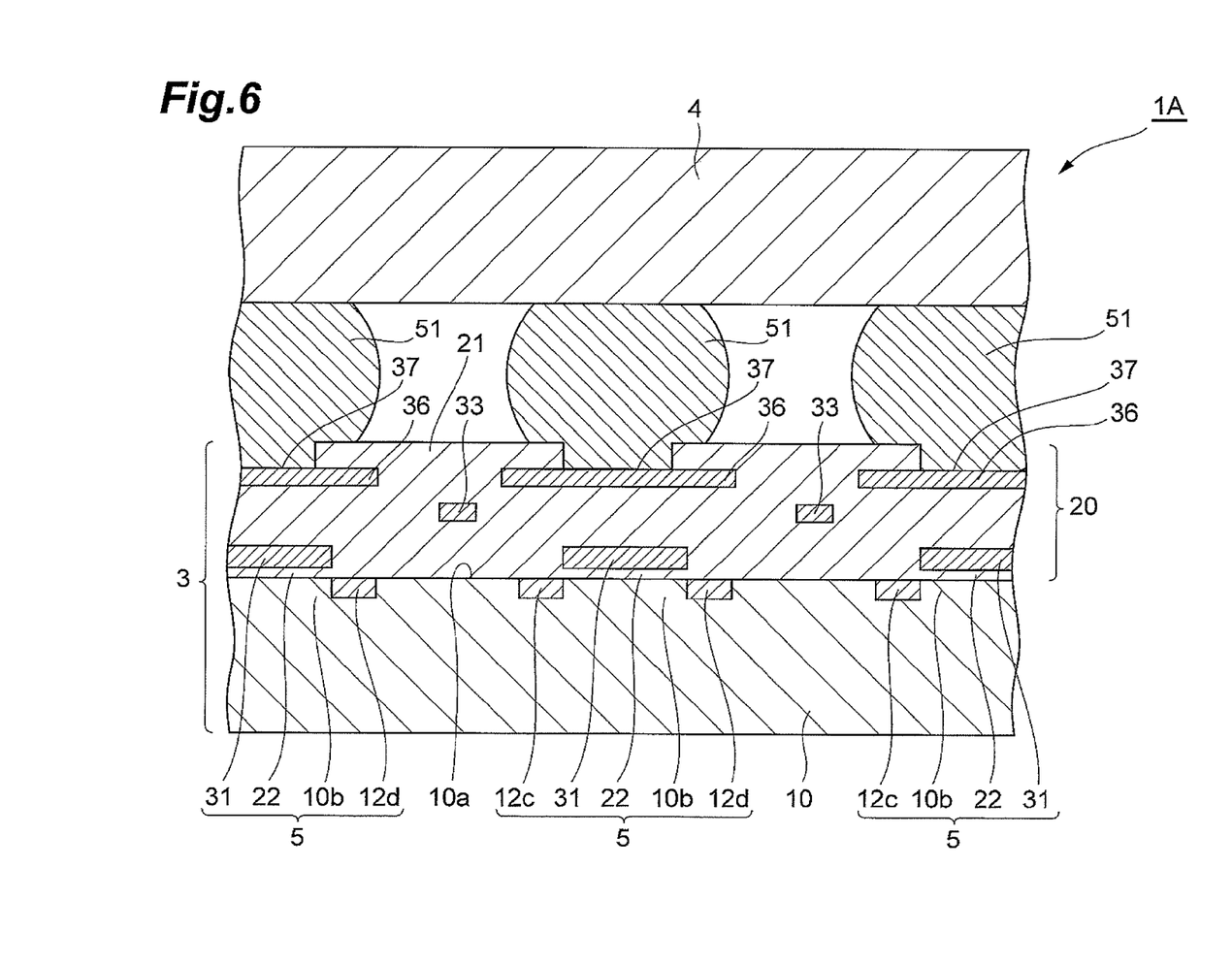
FIG. 6 is a cross-sectional view illustrating a VI-VI cross section of FIG. 5.
Figure 7:
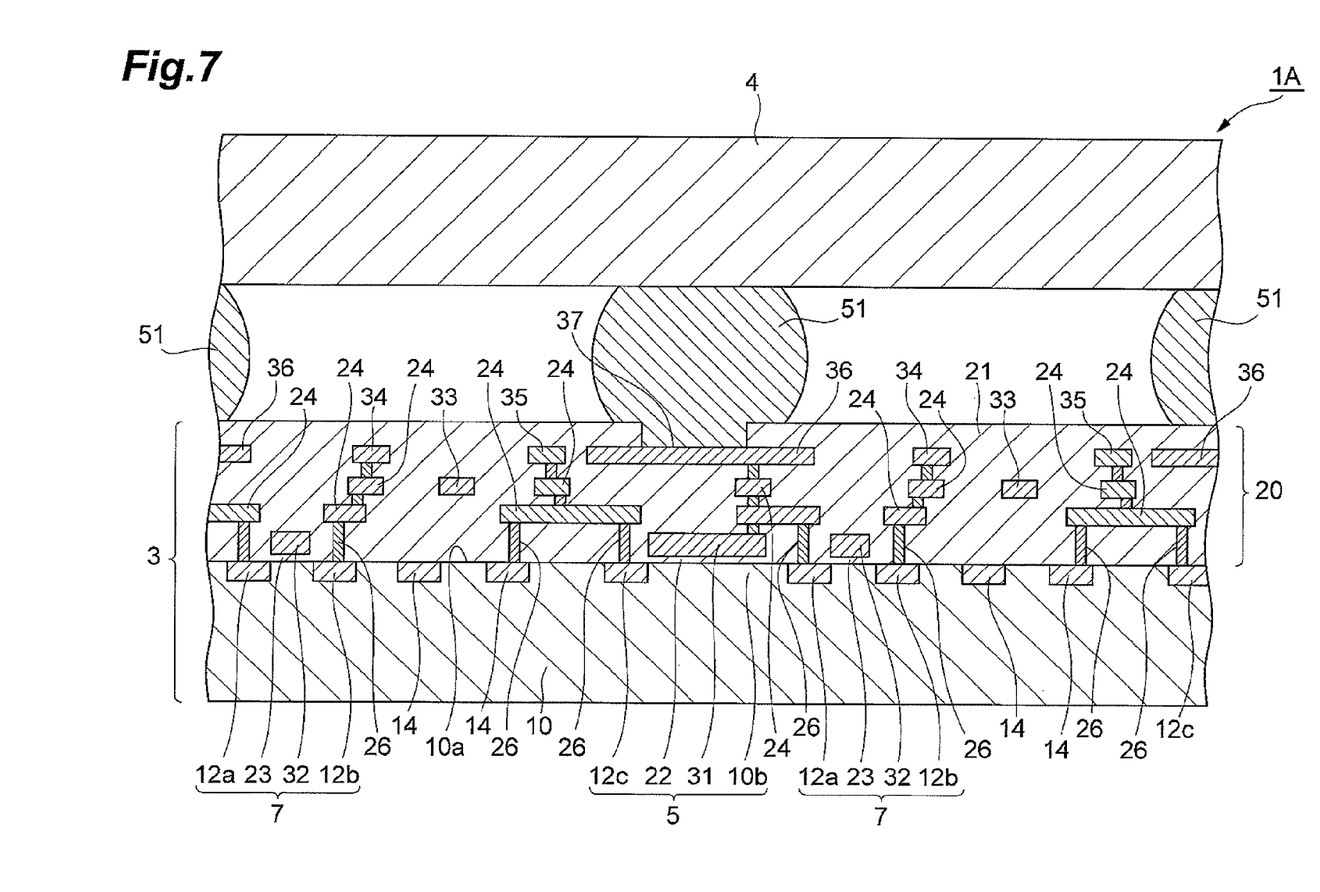
FIG. 7 is a cross-sectional view illustrating a VI-VII cross section of FIG. 5.

FIGS. 4 to 7 are drawings illustrating the detailed structure of the circuit board 3. FIG. 4 and FIG. 5 are top plan views illustrating a portion of the circuit board 3 on an enlarged scale. FIG. 5 illustrates a state in which top metal films (top metals) 36 of the respective pixel circuit sections 3a are omitted. FIG. 6 is a cross-sectional view illustrating a VI-VI cross section of FIG. 5. FIG. 7 is a cross-sectional view illustrating a VII-VII cross section of FIG. 5. FIGS. 6 and 7 also illustrate the charge generation section 4 and bump electrodes 51.

As illustrated in FIGS. 4 to 7, the circuit board 3 of the present embodiment includes a semiconductor substrate 10 and, a wiring layer 20 disposed on a surface 10a of the semiconductor substrate 10. The semiconductor substrate 10 is made, for example, of Si and its conductivity type is, for example, p-type. Impurity diffused regions 12a to 12d are formed per pixel circuit section 3a on the surface 10a. The impurity diffused regions 12a to 12d are regions where an impurity to impart a conductivity type (e.g., n-type) different from the conductivity type of the semiconductor substrate 10 is diffused in a high concentration in the surface 10a of the semiconductor substrate 10.

The wiring layer 20 includes four wire layers formed inside an insulating layer 21. The insulating layer 21 includes, for example, silicon oxide (e.g., $SiO_2$) deposited on the semiconductor substrate 10 by CVD or the like. In the first layer closest to the semiconductor substrate 10, a gate electrode 32 and a conductor layer 31 are formed per pixel circuit section 3a. The gate electrode 32 is a gate electrode of a MOS transistor 7 and is disposed on a partial region of the semiconductor substrate 10 with an insulating oxide film 23 in between. Namely, the gate electrode 32 faces the partial region of the semiconductor substrate 10 through the insulating oxide film 23. The insulating oxide film 23 is formed, for example, by oxidation of the surface of the semiconductor substrate 10. Therefore, when the semiconductor substrate 10 is a Si substrate, the insulating oxide film 23 primarily contains $SiO_2$. The aforementioned impurity diffused regions 12a and 12b are disposed on both sides of the partial region of the semiconductor substrate 10. The impurity diffused regions 12a and 12b function as the drain region and source region of the MOS transistor 7.

The conductor layer 31 is disposed on another partial region 10b of the semiconductor substrate 10. The partial region 10b exists in a superficial portion including the surface 10a of the semiconductor substrate 10 in the thickness direction of the semiconductor substrate 10 and includes a region located immediately below the conductor layer 31, in a plane along the surface 10a of the semiconductor substrate 10. The partial region 10b may include a surrounding region around the region located immediately below the conductor layer 31 as well. In the present embodiment, the below-described impurity diffused regions 12c, 12d are not included in the partial region 10b. An insulating layer 22 is interposed between the conductor layer 31 and the partial region 10b of the semiconductor substrate 10. Namely, the conductor layer 31 faces the partial region 10b of the semiconductor substrate 10 through the insulating layer 22. The insulating layer 22 is formed, for example, by oxidation of the surface of the semiconductor substrate 10 as the insulating oxide film 23 is. Therefore, when the semiconductor substrate 10 is a Si substrate, the insulating layer 22 primarily contains $SiO_2$. The insulating layer 22 may be formed simultaneously with the insulating oxide film 23. The conductor layer 31 may be made of the same material as a constituent material of the gate electrode 32 of the MOS transistor 7 and may be formed simultaneously with the gate electrode 32. The conductor layer 31, the insulating layer 22, and the partial region 10b of the semiconductor substrate 10 constitute the capacitive section 5 and charge is accumulated in the conductor layer 31.

The capacitive section 5 in the present embodiment further includes the aforementioned impurity diffused regions 12c and 12d. The impurity diffused regions 12c and 12d are disposed next to the partial region 10b in such a manner that the partial region 10b of the semiconductor substrate 10 is interposed between them. The impurity diffused regions 12c and 12d may be formed simultaneously with the impurity diffused regions 12a and 12b of the MOS transistor 7. The impurity diffused region 12c and the impurity diffused region 12d are separated from each other.

The wiring layer 20 further includes a plurality of intra-layer wires 24 formed in the second layer and in the third layer, gate wires 33 formed in the third layer, and, data wires 34, bias wires 35, and upper metal films (top metals) 36 formed in the fourth layer (uppermost layer).

The conductor layer 31 of the capacitive section 5, as illustrated in FIG. 7, is electrically connected to the upper metal film 36 through the intra-layer wires 24 and inter-layer wires 26. The conductor layer 31 is electrically connected to the impurity diffused region 12a being the drain region of the MOS transistor 7, through the intra-layer wire 24 and inter-layer wires 26. The insulating layer 21 is removed by etching to form apertures, on the top faces of the upper metal films 36. The surfaces of the metal films 36 exposed from the apertures function as connection pads 37 and the bump electrodes 51 are disposed on the connection pads 37. This makes the conductor layer 31 electrically connected to the charge generation section 4 through the upper metal film 36 and bump electrode 51. The impurity diffused regions 12c and 12d, as illustrated in FIG. 5, are electrically connected to the bias wire 35 through the intra-layer wires 24 and unillustrated inter-layer wires. A constant voltage of predetermined magnitude is always applied to the bias wires 35.

The gate electrode 32 of the MOS transistor 7, as illustrated in FIG. 5, is electrically connected to the gate wire 33 through the intra-layer wire 24 and unillustrated inter-layer wires. The impurity diffused region 12b being the source region of the MOS transistor 7, as illustrated in FIG. 5, is electrically connected to the data wire 34 through the intra-layer wires 24 and unillustrated inter-layer wires.

A plurality of impurity diffused regions 14 are formed separately from the impurity diffused regions 12a-12d on the surface 10a of the semiconductor substrate 10. In the plurality of impurity diffused regions 14, an impurity to impart the same conductivity type (e.g., p-type) as the conductivity type of the semiconductor substrate 10 is diffused in a high concentration in the surface 10a of the semiconductor substrate 10. As illustrated in FIGS. 4 and 5, the plurality of impurity diffused regions 14 are of an elongate shape extending in the column direction and are alternated with the plurality of pixel circuit sections 3a in the row direction. As illustrated in FIG. 5, each impurity diffused region 14 is electrically connected to the bias wire 35 through the intra-layer wires 24 and unillustrated inter-layer wires.

The effects achieved by the radiation image sensor 1A having the above configuration will be described. In the radiation image sensor 1A, the capacitive section 5 accumulating charge includes the partial region 10b of the semiconductor substrate 10, the conductor layer 31 disposed on the partial region 10b, and the insulating layer 22 interposed between the partial region 10b and the conductor layer 31. Namely, the partial region 10b of the semiconductor substrate 10 and the conductor layer 31 face each other through the insulating layer 22 and one of a pair of electrodes of the capacitive section 5 is constituted of a portion of the semiconductor substrate 10. The present embodiment achieves the following effects based on these.

Since the insulating layer 22 can be formed, for example, by oxidation of the surface of the semiconductor substrate 10, the insulating layer 22 can be formed with higher quality and in smaller thickness than in a configuration wherein the insulating layer 22 is deposited by CVD or the like. Therefore, the capacitance per unit area of the capacitive section 5 can be made larger. This can increase the amount of accumulated charge in the capacitive section 5, and suppresses increase of the area needed for one pixel circuit section 3a.

Since increase in accumulated charge amount in the capacitive section 5 leads to increase in saturation charge amount, increase in accumulated charge amount in the capacitive section 5 also contributes to suppression of saturation. Therefore, for example, even in such case where the MOS transistor 7 of a certain pixel circuit section 3a does not operate for some reason or excess charge flows in from the charge generation section 4 because of incidence of a large amount of radiation, the capacitive section 5 of the pixel circuit section 3a will be prevented from saturating, whereby the breakdown of the capacitive section 5 and leakage of charge can be reduced.

The insulating layer 22 and conductor layer 31 of the capacitive section 5 can be formed by the same process as the insulating oxide film 23 and gate electrode 32 of the MOS transistor 7. Therefore, manufacturing processes become simpler. If the capacitive section 5 is formed simultaneously with the MOS transistor 7, the number of manufacturing processes can be reduced.

The conductor layer 31 is made of the same material as the constituent material of the gate electrode 32 of the MOS transistor 7. Since this allows the capacitive section 5 to be simultaneously formed in a process of forming the MOS transistor 7, the number of manufacturing processes can be made smaller. The conductor layer 31 may be made of a material different from the constituent material of the gate electrode 32 of the MOS transistor 7.

The charge generation section 4 of bulk and circuit board 3 are connected to each other by bump bonding such as flip-chip bonding. This allows the charge generation section 4 to be suitably disposed on the circuit board 3.

The present embodiment illustrates the example in which the semiconductor substrate 10 is the p-type and the impurity diffused regions 12a-12d are the n-type. In this case, the MOS transistors 7 are n-MOS transistors. The conductivity types of the semiconductor substrate 10 and impurity diffused regions 12a-12d are not limited to this combination but may be, for example, such that the semiconductor substrate 10 is the n-type and the impurity diffused regions 12a-12d are the p-type. In this case, the MOS transistors 7 are p-MOS transistors. In this case, the impurity diffused regions 14 are preferably high-concentration n-type regions.

FIRST MODIFICATION EXAMPLE

Figure 8:
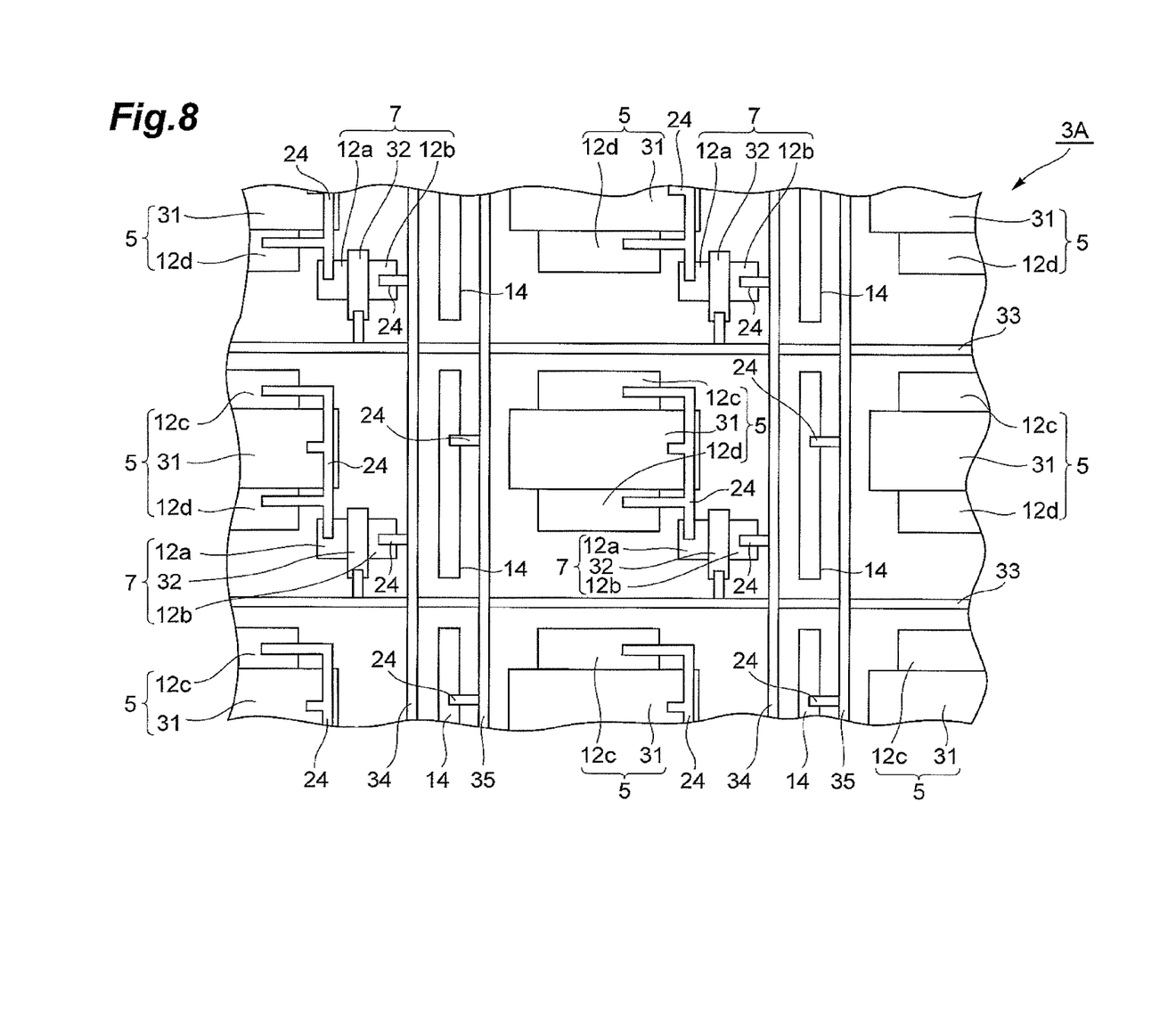
FIG. 8 is a top plan view illustrating a portion of a circuit board according to a first modification example on an enlarged scale.

FIG. 8 is a top plan view illustrating a portion of a circuit board 3A according to the first modification example of the above embodiment on an enlarged scale, and illustrates a state in which the upper metal films (top metals) of the respective pixel circuit sections 3a are omitted, as FIG. 5 does. The configuration of the circuit board 3A in the present modification example is the same as the configuration of the circuit board 3 in the above embodiment, except for the contents described below.

In the circuit board 3A of the present modification example, as illustrated in FIG. 8, the intra-layer wires connecting the bias wires 35 and the impurity diffused regions 12c, 12d to each other are not provided, different from the above embodiment. Instead thereof, the intra-layer wire 24 electrically connecting the impurity diffused regions 12c and 12d and the conductor layer 31 to each other is provided.

Since the impurity diffused regions 12c and 12d are disposed next to the partial region 10b (cf. FIG. 6) of the semiconductor substrate 10, pn junctions are formed by the impurity diffused regions 12c and 12d and the semiconductor substrate 10. The impurity diffused regions 12c and 12d are short-circuited to the conductor layer 31. In this configuration, if the charge accumulation amount in the capacitive section 5 exceeds a certain threshold, excess charge will flow between the conductor layer 31 and the semiconductor substrate 10 through the impurity diffused regions 12c and 12d, which can eliminate the excess charge. Therefore, the present modification example can further reduce the breakdown of the capacitive section 5 and leakage of charge, even in such case where the MOS transistor 7 of a certain pixel circuit section 3a does not operate for some reason or excess charge is generated because of incidence of a large amount of radiation.

The pn junction portions between the semiconductor substrate 10 and impurity diffused regions 12c and 12d include a capacitive component. This capacitive component contributes to increase in capacitance of the capacitive section 5. Therefore, the present modification example can further increase the accumulated charge amount of the capacitive section 5, and suppresses increase in the area of each pixel circuit section 3a.

In the present modification example, the pn junction portion between the partial region 10b and impurity diffused region 12c and the pn junction portion between the partial region 10b and impurity diffused region 12d are disposed at respective positions where the pn junction portions do not overlap the conductor layer 31, when viewed from the thickness direction of the circuit board 3A, and the pn junction portions are separated from each other. In other words, these pn junction portions are not integrally formed to cover the lower portion of the conductor layer 31. This can reduce the surface area of the pn junction portions and reduce dark current. In the present modification example, the impurity diffused regions 12c and 12d are not separated from the region immediately below the conductor layer 31. If the impurity diffused regions 12c and 12d are separated from the region immediately below the conductor layer 31, the area of the capacitive section 5 will increase, so as to increase the pixel pitch. Since the increase of the pixel pitch results in increasing the spacing between bump electrodes 51 and thus, in turn, results in increasing the voltage necessary for transferring the charge generated in the charge generation section 4, through the bump electrodes 51 to the capacitive sections 5. Since the pixel area can be made smaller because of the configuration wherein the impurity diffused regions 12c and 12d are not separated from the region immediately below the conductor layer 31, the resolution can also be enhanced by decrease in pixel pitch. Namely, when viewed from the thickness direction of the circuit board 3A, the edge of the conductor layer 31 and the edges of the impurity diffused regions 12c and 12d approximately coincide, thereby efficiently achieving the effects of the present modification example.

SECOND MODIFICATION EXAMPLE

Figure 9:
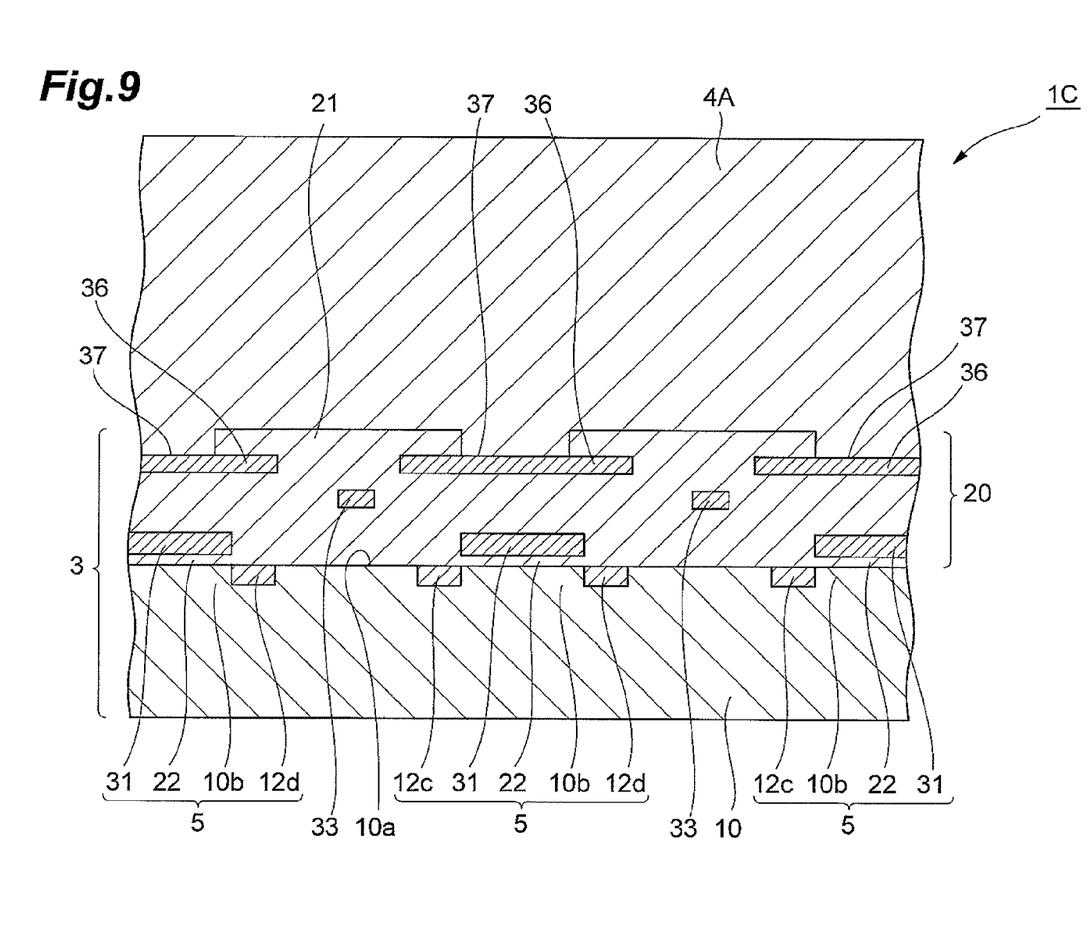
FIG. 9 is a cross-sectional view illustrating a configuration of a radiation image sensor according to a second modification example.
Figure 10:
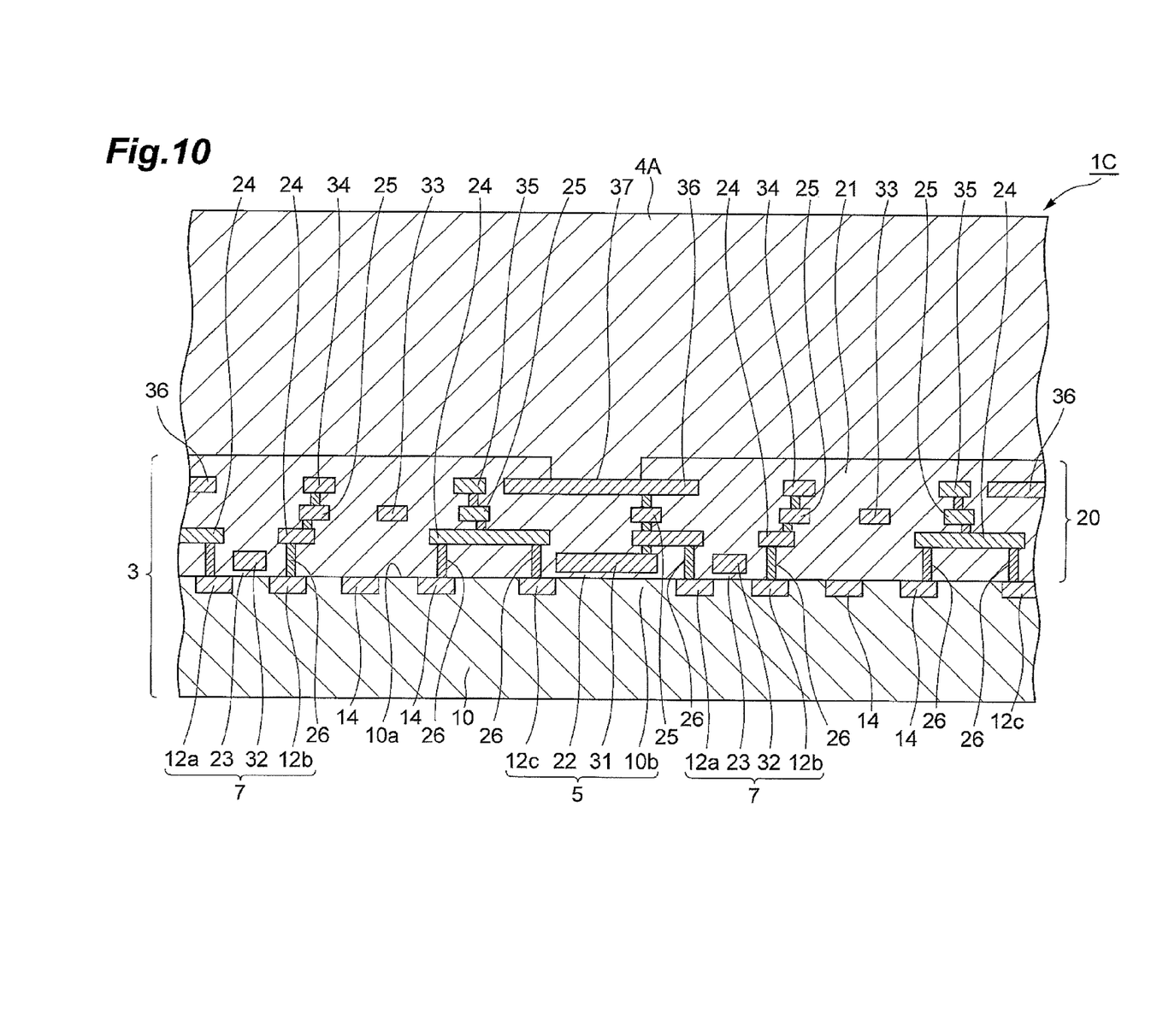
FIG. 10 is a cross-sectional view illustrating the configuration of the radiation image sensor according to the second modification example.

FIG. 9 and FIG. 10 are cross-sectional views illustrating a configuration of a radiation image sensor 1C according to the second modification example of the above embodiment and illustrate respective cross sections corresponding to the VI-VI cross section and VII-VII cross section of FIG. 5.

The radiation image sensor 1C of the present modification example is different in connection configuration between the circuit board and the charge generation section from the radiation image sensor 1A of the foregoing embodiment. As illustrated in FIGS. 9 and 10, the present modification example is configured without bump electrodes between the circuit board 3 and charge generation section 4A and, the circuit board 3 (particularly, the connection pads 37) and the charge generation section 4A are in direct contact. In this case, the charge generation section 4A, different from the form using the bulk one as in the above embodiment, is made by depositing a material that absorbs radiation to generate charge (e.g., CdTe), on the circuit board 3.

As in the present modification example, the charge generation section 4A may be formed by vapor deposition on the circuit board 3. This allows the charge generation section 4 to be suitably disposed on the circuit board 3.

THIRD MODIFICATION EXAMPLE

Figure 11:
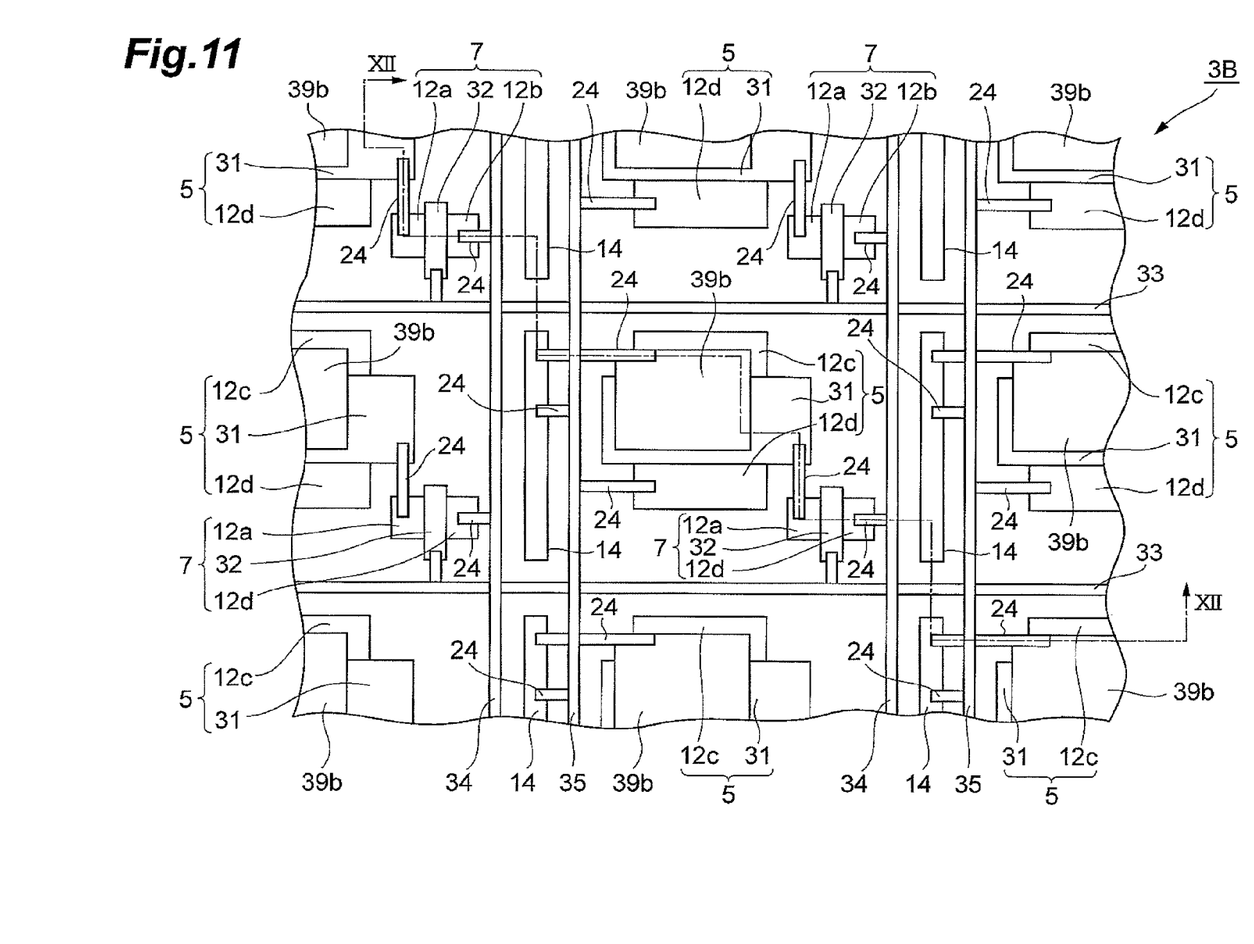
FIG. 11 is a top plan view illustrating a portion of a circuit board on an enlarged scale, as a third modification example.
Figure 12:
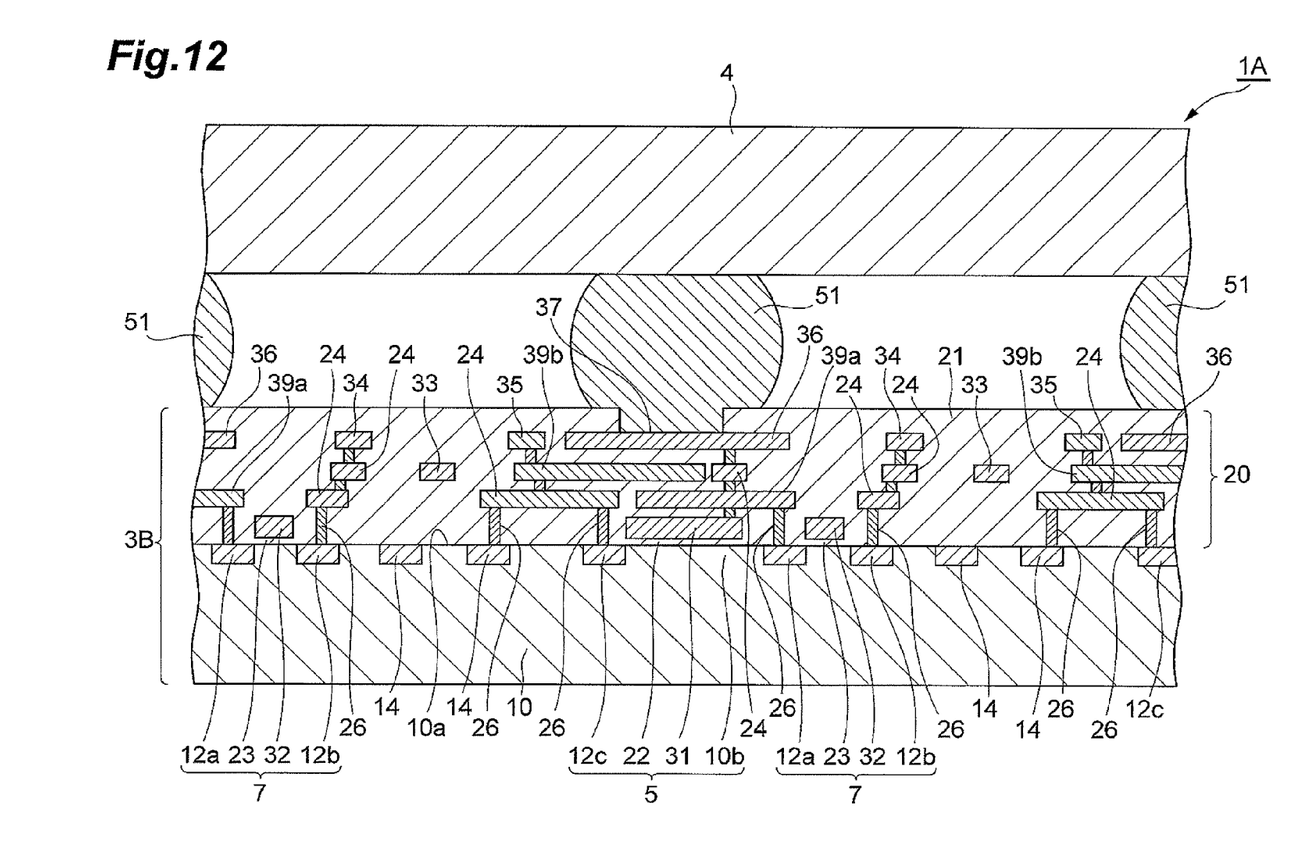
FIG. 12 is a cross-sectional view illustrating a XII-XII cross section of FIG. 11.

FIGS. 11 and 12 are drawings illustrating the third modification example of the foregoing embodiment. FIG. 11 is a top plan view illustrating a portion of a circuit board 3B in the present modification example on an enlarged scale. FIG. 11 illustrates a state in which the upper metal films 36 of the respective pixel circuit sections 3a are omitted. FIG. 12 is a cross-sectional view illustrating a XII-XII cross section of FIG. 11. FIG. 12 also illustrates the charge generation section 4 and bump electrodes 51.

As illustrated in FIGS. 11 and 12, the circuit board 3B of the present modification example further includes second conductor layers 39a and third conductor layers 39b, in addition to the configuration of the circuit board 3 in the above embodiment. The second conductor layers 39a are formed in the second layer of the wiring layer 20 and extend along the bottom faces of the upper metal films 36. The second conductor layer 39a is electrically connected to the conductor layer 31 and upper metal film 36 through the inter-layer wires 26. The third conductor layers 39b are formed in the third layer of the wiring layer 20, are disposed between the upper metal films 36 and the second conductor layers 39a, and extend along the bottom faces of the upper metal films 36. The third conductor layer 39b is electrically connected to the bias wire 35 through the inter-layer wire 26 and electrically connected to the impurity diffused region 14 through the intra-layer wire 24 and inter-layer wires 26.

In the present modification example, the second conductor layer 39a and the third conductor layer 39b face each other with the insulating layer 21 in between and the upper metal film 36 and the third conductor layer 39b face each other with the insulating layer 21 in between. Therefore, capacitive components accumulating charge are formed between the second conductor layer 39a and the third conductor layer 39b and between the upper metal film 36 and the third conductor layer 39b. As the conductor layers are provided as two or more layers in this manner, the capacitance of the capacitive section 5 is further increased and a larger amount of charge can be accumulated therein. Therefore, even in such case where the MOS transistor 7 does not operate for some reason or excess charge flows in from the charge generation section 4, the capacitive section 5 can be prevented from saturating, whereby the breakdown of the capacitive section 5 and leakage of charge can be more reduced.

The radiation image sensors according to the present invention are not limited to the above-described embodiment but can be modified in many other ways. For example, the above embodiment showed the illustrative example of the Si substrate as the semiconductor substrate, but substrates made of various semiconductor materials besides the Si substrate can also be applied to the semiconductor substrate.

INDUSTRIAL APPLICABILITY

The present invention is applicable to the radiation image sensors.

REFERENCE SIGNS LIST 1A, 1C radiation image sensor; 2 base substrate; 3, 3A, 3B circuit board; 3a pixel circuit sections; 3b vertical shift register section; 3c readout circuit section; 4, 4A charge generation section; 5 capacitive sections; 7 MOS transistors; 10 semiconductor substrate; 12a to 12d impurity diffused regions; 14 impurity diffused regions; 20 wiring layer; 21, 22 insulating layers; 23 insulating oxide layer; 24 intra-layer wires; 26 inter-layer wires; 31 conductor layers; 32 gate electrodes; 33 gate wires; 34 data wires; 35 bias wires; 36 upper metal films; 37 connection pads; 42 integration circuits; 44 holding circuits; 51 bump electrodes.

The invention claimed is:

1. A radiation image sensor comprising:
a charge generation section absorbing radiation to generate charge; and
a circuit board accumulating and transferring the charge generated in the charge generation section,
wherein the charge generation section is disposed on the circuit board,
wherein the circuit board includes:
 a semiconductor substrate;
 a metal film including a connection pad electrically connected to the charge generation section;
 a capacitive section accumulating the charge generated in the charge generation section; and
 a MOS transistor in the semiconductor substrate, the MOS transistor including one end connected to the capacitive section and another end connected to a wire transferring the charge, and
wherein the capacitive section includes a partial region of the semiconductor substrate, a conductor layer disposed on the partial region and electrically connected to the charge generation section, and an insulating layer interposed between the partial region and the conductor layer, and
wherein the metal film is electrically connected to the conductor layer, and is disposed in such a manner that the metal film and the conductor layer overlap each other in a thickness direction of the circuit board.

2. The radiation image sensor according to claim 1, wherein the conductor layer is made of a same material as a constituent material of a gate electrode of the MOS transistor.

3. The radiation image sensor according to claim 1, wherein the capacitive section further includes an impurity diffused region in which an impurity to impart a conductivity type different from a conductivity type of the semiconductor substrate is diffused, the impurity diffused region being located next to the partial region of the semiconductor substrate, and
wherein the impurity diffused region and the conductor layer are electrically connected to each other.

4. The radiation image sensor according to claim 1, wherein the charge generation section of bulk and the circuit board are connected to each other by bump bonding.

5. The radiation image sensor according to claim 1, wherein the charge generation section is made by depositing a material that absorbs radiation to generate charge on the circuit board.

6. The radiation image sensor according to claim 1, wherein the entire conductor layer overlaps the metal film in the thickness direction of the circuit board.

7. A radiation image sensor comprising:
a charge generation section absorbing radiation to generate charge; and
a circuit board accumulating and transferring the charge generated in the charge generation section,
wherein the charge generation section is disposed on the circuit board,
wherein the circuit board includes:
 a semiconductor substrate;
 a capacitive section accumulating the charge generated in the charge generation section; and
 a MOS transistor in the semiconductor substrate, the MOS transistor including one end connected to the capacitive section and another end connected to a wire transferring the charge, and
wherein the capacitive section includes a partial region of the semiconductor substrate, a conductor layer disposed on the partial region and electrically connected to the charge generation section, and an insulating layer interposed between the partial region and the conductor layer,
wherein the capacitive section further includes an impurity diffused region in which an impurity to impart a conductivity type different from a conductivity type of the semiconductor substrate is diffused, the impurity diffused region being located next to the partial region of the semiconductor substrate, and
wherein the impurity diffused region and the conductor layer are electrically connected to each other.

* * * * *